United States Patent Office 3,799,891
Patented Mar. 26, 1974

3,799,891

GOLD COMPOSITION FOR BONDING GOLD TO A CERAMIC SUBSTRATE UTILIZING COPPER OXIDE AND CADMIUM OXIDE

Baynard R. Smith, 701 Lakeside Drive, North Palm Beach, Fla. 33408

No Drawing. Continuation-in-part of application Ser. No. 232,943, Mar. 8, 1972. This application Apr. 27, 1972, Ser. No. 248,014

Int. Cl. H01c 7/00

U.S. Cl. 252—514 13 Claims

ABSTRACT OF THE DISCLOSURE

A composition for, as well as a method of bonding gold to a ceramic substrate and a bonded gold article which includes a composition of gold, copper oxide, and cadmium oxide for bonding a gold layer to a ceramic substrate. Gold powder, copper oxide particles and cadmium oxide particles define a solid composition mixture where the copper oxide has a weight percentage in the preferred region between 0.25% and 3.0% and the cadmium oxide has a weight percentage in the preferred region between 1.0% and 5.0%. Organic binder is added to a predetermined amount of the copper oxide and cadmium particles and then blended. The gold powder is incorporated into the copper oxide, cadmium oxide, and organic binder to form a total composition mixture. The organic binder has a weight percentage of the total composition mixture within the ranges of 10% to 95%. The total composition mixture is blended and applied to a ceramic substrate. The coated ceramic article is fired within the preferred temperature range 950° C. to 1000° C. Copper oxide crystals impregnate the ceramic substrate and form a high strength bond between the gold layer and the ceramic substrate.

CROSS-REFERENCE TO RELATED APPLICATION

This application is a continuation-in-part of my copending application Ser. No. 232,943,filed Mar. 8, 1972.

BACKGROUND OF THE INVENTION

Field of the invention

This invention pertains to compositions and methods for bonding gold ceramic substrates. In particular this invention relates to the field of bonding gold to ceramic substrates using a combined copper oxide and cadmium oxide composition as the major bonding agent. More in particular, this invention pertains to the field of ceramic articles of manufacture having a gold layer bonded thereto. Still further this invention relates to the field of bonding gold layers to ceramic substrates at low firing temperatures.

Prior art

Compositions, and methods for bonding gold to ceramic substrates are known in the art. In addition, ceramic articles of manufacture are known which have a gold layer adhered thereto. However, in general, the mechanics of bonding gold to ceramic material has included the addition of a predetermined percentage of glass frits into the gold. The glass frits are usually incorporated in an organic binder and mixed or blended with gold powder prior to the application to the ceramic substrate. The composition (including the gold, the organic binder, and ceramic article) is heated to a temperature approaching the melting temperature of the glass. The glass frits then essentially wet the base ceramic surface and the gold and serve as a bonding agent.

In the priort art, where gold or gold alloys are mixed with organic binders containing glass frits, it has been found that an acceptable bond strength is obtained when the glass frit by weight percentage of the total composition reaches approximately 20%. However, the electrical resistivity of such compositions may be as high as 0.03 ohm/square/mil. Since a major use of such bonds is in the production of circuit boards, the high electrical resistivity is a distinct disadvantage.

When the glass frit weight percentage is diminished to approximately 2%, a lower electrical resistivity of the coating is achieved. However, the low percentage of glass frits leads to a low bonding strength, and the coating is easily removable. In practice, a trade off study is usually used where a low percentage of glass frits with a low bonding strength is traded off against a high percentage of glass frits having a high electrical resistivity. Very often, prior techniques and compositions called for a glass frit composition approaching a weight percentage of 10%. The electrical resistivity formed in the coating layer of the present invention is approximately the same as pure gold within 2% to 3%. This resistivity is substantially lower than the prior art glass frit bonded gold.

Ceramic substrate gold coatings are generally manufactured having a thickness range between 200 millionths and 1,000 millionths of an inch. This thickness range is necessary in order that a sufficient amount of glass be present in the composition in order to affect an acceptable bond. In the instant invention, where no glass or inorganic binder is used, the gold coating or layer on the ceramic substrate may be reduced to 50 millionths of an inch while maintaining an acceptable bonding action. Where glass frits are used it is evident that the cost of manufacture of coated ceramic substrates must by necessity go up while at the same time inefficiently using a natural resource.

With the addition of cadmium oxide to the copper oxide powder of the present invention the firing temperature may be significantly reduced in order to get a good bonding layer. Without cadmium oxide introduced into the mixture composition optimum bonding firing temperatures are found within the range of 1020° C. to 1040° C. With the addition of cadmium oxide powder the firing temperature can be reduced to 850° C. with a preferred firing temperature range between 950° C. and 1000° C. The ability to lower the firing temperature permits the use of ovens which cannot reach the 1000° C. level as well as permitting the use of ceramic substrates which may suffer a structural degradation when their temperature is raised above the 1000° C. level.

Where glass frits or other known bonds are used, the thermal conductivity of the gold layer has been found to be low. This disadvantage has the effect of producing unwanted thermal gradients between the ceramic substrate and any mounted circuitry. In the present invention where the only constituents of the bonded layer are copper oxide and cadmium oxide in combination with the gold, the overall density of the layer approximates that of the gold and further has a thermal conductivity approaching that of the pure gold.

In hybrid circuits, in some prior cases, it has been found that the glass frits contained in the gold were not compatible with the glass frits in the printed resistors. This condition possibly causes formation of bubbles and voids between the mating surfaces. From this, inaccurate readings and stresses may be built up to change the electrical characteristics of the aforementioned resistors. In the instant invention, the gold coating remains relatively inert with respect to electrical parameters.

In other prior art such as Pat. No. 3,450,545 the bonded layering includes between 4% and 35% inorganic powder which may be a glass type frit. Where any sizeable percentage of glass type frit/inorganic binder powder is used, then the density of the gold necessarily decreases.

Other prior art, such as that shown in Pat. No. 2,733,167 does bond gold to a non-porous ceramic surface for various decorative purposes. However, such bonding of gold uses organic compounds of copper and do not begin with a copper oxide as in the present invention. Such prior art provides and utilizes a glazed ceramic surface or glass base to provide a coating which is only a few millionths of an inch in thickness. Such small thicknesses of gold bonding are easily removable and not applicable to the thicknesses needed in the bonding of integrated or hybrid circuitry.

Still other prior art, such as Pat. No. 3,403,043 and No. 3,429,736 provide refractory powders for ceramic bondings such as tungsten or molybdenum which must be fired in a reducing atmosphere. Where such refractory powders are fired in the air, as in the instant invention, compounds would oxidize and there would no longer be a metal layer on the ceramic substrate. In other prior art such as that shown in Pat. No. 3,647,534 there is shown the use of cuprous oxide applied to a ceramic surface for forming a weldable surface on a ceramic member. However, the ceramic is immersed in a nickel solution for depositing a layer of nickel on the reacted area and is not applicable to the gold bonded layer as in the present invention. Further, this prior art does not show the condition of cadmium oxide for incorporation into the cuprous oxide in order to lower the firing temperature of the ceramic substrate.

SUMMARY OF THE INVENTION

A metalizing composition which comprises an intimate mixture on a weight basis of: (A) about 0.1% to 7.0% of at least one copper oxide powder from the group consisting of cuprous oxide and cupric oxide; (B) about 0.01% to 15.0% of cadmium oxide powder; (C) 78.0% to 99.89% of gold powder, the copper oxide powder and the cadmium oxide powder in combination with the gold powder defining a solid composition mixture where the weight percentages of the copper oxide, the cadmium oxide, and the gold powder pertain to the solid composition mixture; and, (D) about 10.0% to 95.0% of an organic binder devoid of glass frits, where the organic binder in combination with the copper oxide powder, the cadmium oxide powder and the gold powder define a total composition mixture and the weight percentage of the organic binder pertains to the total composition mixture.

DESCRIPTION OF THE PREFERRED EMBODIMENT

In accordance with the invention to be described in the following paragraphs there is provided a composition and method for bonding gold to an alumina or ceramic substrate utilizing a combination of copper oxide and cadmium oxide as the prime bonding agents. As a direct outgrowth of the composition and method there is also provided an article of manufacture invention which results in a ceramic substrate having a gold, copper oxide, and cadmium oxide layer bonded thereto. All of the embodiments of the invention as herein described pertain to the bonding of gold to a ceramic or alumina substrate. One of the major disadvantages found in using prior compositions and methods for bonding gold layers to ceramic substrates has been the necessary high firing temperature required. The addition of the cadmium oxide to the copper oxide for the bonding of gold to a ceramic substrate has permitted the firing temperature to be reduced into the range as low as 850° centigrade. Since many ceramic substrates show degraded properties when their temperature is brought into a higher temperature region, it becomes a distinct advantage to maintain all firing temperatures as low as possible. Further, many ovens cannot handle extended temperature ranges and the expense and cost of maintaining an oven which will give a firing temperature over 1,000° centigrade may be prohibitive.

The field of bonded gold layers to ceramic substrates have many uses, one of which lies in the field of integrated circuits where semi-conductor devices or chips are bonded to various ceramic substrates. Other uses for this invention lies in the field of hybrid circuitry where semi-conductor devices are bonded to various conductive portions of the circuits of the aforementioned ceramic substrates. The invention as herein disclosed permits the use of a much thinner coating of gold to be bonded to the ceramic substrates than has been previously used. This advantage allows the saving of a natural resource and may cut the cost of producing integrated circuits and hybrid circuitry to a great extent. The ceramic substrates which are referred to in this disclosure are generally composed of alumina and beryllium oxide and are commercially available.

The composition and method for bonding gold to a ceramic substrate in accordance with the present invention provides a thin coating of gold on the ceramic substrate which is not easily removable. Further, the composition, as will be described permits the final coated ceramic layer to have a high thermal conductivity coupled with a low electrical resistivity. The final coating, in addition, has a density substantially equivalent to gold and the bond is found to be insensitive to repeated thermal processing such as subjecting the bonded ceramic substrate to consecutive temperature cycling within ranges exceeding several hundred degrees.

The metalizing or bonding compositions of the invention comprise intimate mixtures, on a weight percentage basis, of: (A) 0.1% to 7.0%, preferably 0.25% to 3.0% of at least one copper oxide additive in powder form from the group consisting of cuprous oxide and cupric oxide; (B) 0.01% to 15.0%, preferably 1.0% to 5.0% of cadmium oxide powder; (C) 78.0% to 99.89% of gold powder, the weight percentages of copper oxide, cadmium oxide, and gold powder defining the weight percentages of a solid mixture composition with the weight percentages of the copper oxide, cadmium oxide, and gold powder summing to substantially 100%; and (D) about 10.0% to 95.0%, preferably 15% to 50%, of an organic binder devoid of glass frits, the weight percentages of the organic binder defining the weight percentages of a total mixture composition including the copper oxide, gold powder, cadmium oxide, and organic binder in combination.

The addition of the organic binder, component (D) has been found to significantly improve the quality of bonding gold to ceramic substrates when coatings of the compositions are fired onto the aforementioned ceramic substrates. The absence of glass frits in component (D) permits direct interaction of both components (A) and (B) in combination with component (C), to the ceramic substrate. The resulting bond achieved relies basically on the copper oxide and cadmium oxide components (A), (B) being the adhesive mechanism between the gold component (C) and the ceramic substrate. The inventive compositions as herein described constitute a preferred group of bonding or metalizing compositions since they provide bonding layers having a high joint or tensile loading strength or layered thicknesses ranging from 50 millionths to .002 inch. Additionally, the electrical resistance of the bond constituting the invention is substantially less than gold pastes containing glass frits. Where glass frits are used in the bonding composition, electrical resistivities ranging from 0.0015 to 0.030 ohm/square/mil have been observed. The use of the cadmium oxide component (B) permits the firing temperatures to be lowered into the ranges of 850° centigrade and allows a large class of ceramic substrates to be used for these bonding purposes. The present composition provides an electrical resistivity in the order of 0.001 ohm/square/mil or less which reduces electric power loss when this composition is used in the construction of circuitry. Further, low thermal gradients occur between the substrate and components attached to the bonded layer since the components (A), and (C) have extremely high thermal conductivities in the ranges of 224.0 and 169.0 B.t.u./hr./sq. ft./deg. F. respectively as opposed to the thermal conductivity of glass frits in the order of 0.59 B.t.u./hr./sq. ft./deg. F. The most preferred compositions of the invention are those in which the metal components defining the solid composition mixture consist essentially of from 0.25% to 3.0% of copper oxide and 1.0% to 5.0% of cadmium oxide with the remaining portion of the solid composition mixture being made up of the gold powder where all of the percentages refer to weight percentages.

As is the usual case for bonds or metalizing compositions of this nature, such are usually applied to a ceramic substrate through silk screening, printing, brushing or some like technique. The application is generally performed in an ambient air environment at a temperature approximating normal room conditions (i.e. 22° C.), although such is not critical to the inventive concept. The coated substrate is fired in an oven between the temperature ranges of 850° C. and 1063° C., with a preferred temperature firing range between 950° C. and 1000° C. The coated ceramic substrate is maintained in the oven in an oxidizing atmosphere, until the substrate reaches substantial thermal equilibrium with the surrounding high temperature atmosphere.

The cadmium oxide powder or particles used in this composition as well as the copper oxide particles (cuprous oxide or cupric oxide) are generally milled or ground to a dimensional size less than one micron in length. The gold powder which is commercially bought has a dimensional size in the range between 2 and 5 microns. The cadmium powder is commercially available from a number of companies in this field such as Fisher Scientific Company, Chemical Manufacturing Division, located in Fair Lawn, N.J.

The method invention for producing a thin, high thermally conductive, low electrically resistive bonding layer on a ceramic substrate is disclosed in the following paragraphs.

Copper oxide (cupric oxide, cuprous oxide) particles are mixed with cadmium oxide powder in specific weight percentage of the composition mixture. The now combined copper oxide and cadmium oxide particulates are then incorporated into toluol, benzene, alcohol, acetone or some like composition to form a conglomerate mitxure. The mixture is all milled or passed through some like technique for a time approximating the range between 2 and 24 hours. This step breaks down the combined copper oxide and cadmium oxide particulates to a fine powder preferably in the sub-micron dimensional size range. The time of milling is not critical to the inventive concept as herein defined but such milling or grinding techniques are maintained until the particulates have substantially reached the fine powder texture desired.

The combined mixture is then dried in a standard oven until the copper oxide powder and cadmium oxide powder is substantially devoid of volatile material. In practice, the oven has been maintained at a temperature approximating 100° C. for between 1 and 5 hours dependent on the weight of the combined or conglomerate mixture being dried. The oven or other drying mechanism temperature and time of drying for this step is not critical to the inventive concept, with the only restriction placed on these parameters being that upon termination of this drying step that the remaining copper oxide and cadmium oxide powder be substantially free of the volatile material used in forming the combined or conglomerate mixture.

The resulting dry cadmium oxide and copper oxide (cupric oxide or cuprous oxide) is blended into a commercially available organic binder in predetermined weight percentages. The blending step is accomplished in a standard paint mill (wet grinder), tumbler or some like mechanism. The blending in this manner disburses the copper oxide and cadmium oxide powder and substantially breaks up possible existing agglomerates. The combined copper oxide and cadmium oxide is blended into the organic binder each of which have weight percentage ranges of between 0.1% to 7.0% and 0.1% to 15.0% respectively of the solid composition mixture comprising the copper oxide, the cadmium oxide, and the gold powder with a weight percentage range extending between approximately 78.0% to 99.89%.

The organic binder used in this step has a weight percentage range between 10% and 95% of the total mixture composition comprising the copper oxide, the cadmium oxide, the gold powder, and the organic binder. In this phase of the process step organic binders such as beta terpinol, ethyl, cellulose mixture, pine oil, methyl, cellulose or like compositions may be used. In actual practice, commercially available organic binders have been used including, Ferro Vehicle Corp. Binder H-216, Alpha Metals Corp., Binder Reliafilm No. 5181 and L. Reusche and Co. Binder Medium No. 163-C.

The blending of the copper oxide and cadmium oxide with the organic binder forms an intermediate mixture having weight percentages within the ranges previously defined. The gold powder is then mixed into the intermediate mixture of copper oxide, cadmium oxide and organic binder. The weight percentage of the gold powder as a function of the solid composition mixture herein defined has a range between 78.0% and 99.89% with a preferred range between 92.0% and 98.75%. The inclusion of the gold powder into the intermediate mixture forms the total mixture composition now comprising the gold powder, copper oxide, cadmium oxide, and organic binder.

The mixing step is accomplished in a wet grinder, wet three roll grinder, paint mill mechanism, or other commercially available mixing mechanisms well known in the art. In this step the copper oxide and cadmium oxide particles are evenly disbursed into the surrounding gold powder. The solid particles are preferably wetted in an even manner and a substantially homogeneous blend is formed of the total mixture composition .

The total mixture composition is applied to a ceramic substrate through silk screening, printing, brushing, hand dipping, or another number of methods not important to the inventive concept as herein detailed. The application of the total mixture composition to the ceramic substrate is accomplished preferably in an ambient atmosphere condition, however, such is not important to the invention. In this manner, there is obtained a ceramic substrate coated with a total composition mixture.

The coated ceramic substrate is then introduced into an oven or other heating mechanism. The coated substrate is brought to temperature equilibrium conditions within a range extending between 850° C. and 1063° C., having a preferred temperature range between 950° C. and 1000° C. In this manner, the coated ceramic substrate is fired and may result in a coating thickness of application ranging between 50 millionths and .002 inch. The time of firing the coated ceramic substrate is not critical to the invention, however, the important criteria being that the coated substrate attain substantially thermal equilibrium condiions with the surrounding environment within the heating mechanism at the prescribed temperature ranges as herein described.

During the firing step, substantially all of the organic binder is driven off into the surrounding environment with possibly only residual amounts left in the coating. It has been observed that portions of the copper oxide particles impregnate the alumina or ceramic substrate. In the manner as described, a highly force resistant bond is formed between the gold and the copper oxide and cadmium oxide coating and the ceramic substrate. The resulting bond has been found to form a relatively low electrically resistive coating, additionally having a relatively high thermal conductance.

The method invention as herein described has enumerated a number of procedural steps. In summary, these steps in consecutive order include mixing the copper oxide powder and cadmium oxide powder together followed by milling or grinding the combined copper oxide and cadmium oxide particulates in combination with a medium such as toluol, benzene, or like composition. The combined copper oxide and cadmium oxide powder is then dried to remove any contained volatiles. The mixture is then further mixed with a predetermined weight percentage of organic binder to form the previously defined intermediate mixture. Gold powder in previously defined weight percentage ranges is added to the intermediate mixture to form the total mixture composition. The total mixture composition is then mixed to form a homogeneous blend and applied to an alumina or ceramic substrate. The coated substrate is fired at a particular temperature within defined temperature ranges to form the ceramic substrate bond.

It is to be understood that the method steps as herein described may be taken out of consecutive order in a manner so as to produce substantially the same bonding mechanism. In an embodiment of the invention, it is apparent to those skilled in the art that initially predetermined quantities (in the ranges previously defined) of gold powder, cadmium oxide powder, copper oxide particulates (cuprous oxide or cupric oxide) and organic binder may be weighed and segregated from each other. The copper oxide particles and cadmium oxide may then be reduced in dimensional size, preferably to a size wherein the longest dimension is below one micron in length. This may be accomplished through ball milling or some equivalent technique. Where the copper oxide and cadmium oxide have been mixed with a medium such as toluol, benzene or like composition, the volatiles are removed in a heated oven.

In this embodiment of the invention the dried copper oxide, cadmium, oxide and gold powder may be blended in the dry state by tumbling, mixing or some like mechanism. This blending step forms a relatively coarse mixture of gold powder, cadmium oxide powder, and copper oxide in the previously described percentage ranges. Organic binders which are commercially available may then be mixed into the gold, cadmium oxide and copper oxide composition having a weight percentage of the total mixture composition ranging between 10% and 95%. The total mixture composition may then be incorporated into a wet grinder, wet three rolled grinder, paint mill mechanism or other like mechanism for evenly wetting all solid particles and forming a substantially homogeneous blend. The purpose of this step being to evenly disburse the copper oxide and cadmium oxide particles into the surrounding gold powder. The resulting composition is applied to an alumina or ceramic substrate through silk screening, printing, brushing or other equivalent methods. The coated substrate is fired in an oven at a particular temperature within the ranges of 850° C. and 1063° C. the substrate is cooled to ambient conditions and a strong gold bonding is observed to adhere to the substrate.

The composition and method of production as herein detailed results in a ceramic article of manufacture. According to the present invention there is provided a ceramic article having a fired coating wherein the fired coating includes a mixture of gold, cadmium oxide, and copper oxide. The ceramic fired coating has a preferred thickness range between 50 millionths and .002 inch. Firing temperatures for the coating range between 850° C. and 1063° C. with a preferred temperature range between 950° C. and 1000° C.

In the article of manufacture the gold powder, copper oxide, cadmium oxide and a commercially available organic binder (devoid of glass frits) are mixed together to form a total composition mixture. The weight percentage of the organic binder to the total composition mixture has a range between 10% and 95%. The gold powder, cadmium oxide, and copper oxide in particle form, comprise a solid composition mixture. The weight percentage of the copper oxide to the solid composition mixture has a range between 0.1% and 7% with a preferred range between 0.25% and 3.0%. The gold powder having a micron size between 2 and 5 has a weight percentage of the solid composition mixture between the range of 78.0% and 99.89% with a preferred range between 92.0% and 98.75%. The weight percentage of the cadmium oxide to the solid composition mixture has a range between 0.01% and 15.0% with a preferred range between 1.0% and 5.0%.

The total composition mixture is applied to a ceramic substrate in thicknesses ranging from 50 millionths to .002 inch. The application of the coating is made through hand dipping, silk screening, or other like techniques previously described. The ceramic substrate with the layer comprising the total composition mixture is then fired within an oven between 850° C. and 1063° C., with a preferred temperature firing range between 950° C. and 1000° C.

The resulting ceramic article produced provides a ceramic substrate having a strong gold bonded layer with a layer thickness as low as 50 millionths of an inch in dimension. The organic binder is substantially burned off in the firing step. The observed basic bonding mechanism is seen to possible arise from the growth of crystals of the initially disposed copper oxide and the possible alloying of gold, cadmium oxide, and copper oxide which impregnate the cereamic to form a strong bond between the ceramic and the gold outer layer. The cadmium oxide addition has now permitted the firing temperatures to be reduced into a temperature range which easily accommodates most ceramic materials without degrading any of their properties.

The following examples illustrate the use of copper oxide and cadmium oxide contained within a gold powder to form a superior bond between a gold layer on a ceramic or alumina substrate. Each of the examples set forth the basic formulations of the metalizing compositions of the invention. In each of the examples the copper oxide used was both cuprous oxide and cupric oxide. In each of the examples three runs were made for each of the types of copper oxide utilizing organic binder weight percentages of 10%, 50%, and 95%. Therefore, for each example six test runs were made, three each for cuprous oxide and for cupric oxide wherein all other parameters were held constant. In all example cases for the cupric and cuprous oxide runs, the bonding results were substantially identical. The copper oxide used was milled in order that the individual particulates were dimensionally in the micron range. The gold powder, of commercial stock, had a micron range between 2 and 5. The organic binder used in each of the examples was commercially purchased in accordance with the brands previously described.

The weight percentages defined in each of the examples for the copper oxide and gold powder refers to the percentage weight of the solid composition mixture comprising the gold powder, cadmium oxide and the copper oxide. The weight percentage of the organic binder refers to the weight percentage of the total mixture composition comprising the copper oxide, cadmium oxide, the gold powder, and the organic binder. The basic parameters varied for the examples included firing temperature, and weight percentages of copper oxide, cadimum oxide, gold powder, and organic binder.

EXAMPLE 1

| | Wt. percent |
|---|---|
| Copper oxide (percent solid composition) | 0.1 |
| Cadmium oxide (percent solid composition) | 0.01 |
| Gold powder (percent solid composition | 99.89 |

The copper oxide (both cupric oxide and cuprous oxide were used in all examples) was blended with the gold powder and the cadmium oxide as has been previously described. Organic binder was added as shown in the disclosure. Three separate tests were run using organic binder weight percentages (percent of the total composition) of 10.0%, 50.0%, and 95.0%. The various weight percentages were found to have no appreciable effect on the bond. The total composition mixture (copper oxide, cadmium oxide, gold powder, and organic binder) was applied to a ceramic substrate. The coated substrate was fired at a temperature of 850° C. until thermal equilibrium conditions were achieved. A bond was achieved, however, it was classified as only a fair bond. Particles of gold were distinctly discernible and a small percentage of the coating was found to be removable. The low firing temperature resulted in the fact that low crystalline growth was observed, however, bonding was found to take place between the gold and the ceramic substrate.

EXAMPLE 2

| | Wt. percent |
|---|---|
| Copper oxide (percent solid composition) | 0.1 |
| Cadmium oxide (percent solid composition) | 0.01 |
| Gold powder (percent solid composition | 99.89 |

The gold powder, cadmium oxide, copper oxide and organic binder were blended into a total composition mixture. In addition to the above weight percentages, three separate runs were made using organic binder weight percentages (percent of the total composition) of 10.0%, 50.0%, and 95.0%. The various organic binder weight percentages were found to have no discernible effect on the bond produced. After blending, the total composition mixture (copper oxide, cadmium oxide, gold powder, and organic binder) was applied to a ceramic substrate. The coated substrate, which had substantially the same total composition mixture weight percentages as used in Example 1, was now fired at 1063° C. Some bond was achieved, however, there were areas of discontinuous adhesion. The gold was found to be melted and a low crystalline growth was observed. The bond of the gold to the substrate was classified as poor/fair.

EXAMPLE 3

| | Wt. percent |
|---|---|
| Cadmium oxide (percent solid composition) | 0.01 |
| Gold powder (percent solid composition) | 92.99 |

The gold powder, cadmium oxide, copper oxide, and organic binder were blended into a total composiiton mixture. As is the case in all of the examples herein described, this run was made with both cupric oxide and then separately with cuprous oxide. This fact in combination with the additional restraint of running this example (as well as all the others cited) using organic binder percentages (percent of the total composition) of 10.0%, 50.0%, and 95.0% resulted in six separate runs for each example. The use of cupric oxide or cuprous oxide showed substantially the same bonding characteristics. The different organic binder weight percentages were found to have no appreciable effect on the bond. In each run of this example, the total composition mixture was applied to a ceramic substrate. The coated substrate was fired at a temperature approximating 850° C. As is usual in the firing process, firing continued until thermal equilibrium was achieved. Upon cooling, a bond was observed but the bond had a low crystalline growth. Particles of copper oxide were seen on the upper surface of the coating. A portion of the bond coating was removable and the bond was classified as being in the fair range.

EXAMPLE 4

| | Wt. percent |
|---|---|
| Copper oxide (percent solid composition) | 7.0 |
| Cadmium oxide (percent solid composition) | 0.01 |
| Gold powder (percent solid composition) | 92.99 |

The gold powder, cadmium oxide, copper oxide (cupric oxide and cuprous oxide) were blended into the total composition mixture. As in the case of all examples, six (6) runs were made for this example using both cupric oxide and cuprous oxide with the three organic binder weight percentages (percent of the total composition mixture weight), of 10%, 50%, and 95% forming the basis of each run. As is the case in all examples, the type of copper oxide and the different organic weight percentages were found to have no appreciable effect on the bond produced. The total composition mixture was applied to a ceramic substrate in the standard manner as described previously. The application step was followed by firing the coated substrate, however, the firing temperature was raised to 1063° C. The coated substrate was held in the firing oven during the firing step until the substrate achieved the surrounding environmental temperature. Upon cooling it was noted that a bond had been achieved, however, it was also observed that a portion of the gold had melted. Particles were noted, and believed to be cadmium oxide and copper oxide. Some beading was noted on the visible surface area. The surface was non-homogeneous but a substantial bond was produced resulting in a laboratory classification of fair bond.

EXAMPLE 5

| | Wt. percent |
|---|---|
| Copper oxide (percent solid composition) | 0.1 |
| Cadmium oxide (percent solid composition) | 15.0 |
| Gold powder (percent solid composition) | 84.9 |

The copper oxide (cupric oxide, cuprous oxide) was blended with gold powder and cadmium oxide in the above shown weight percentages of the solid composition. This solid composition was then thoroughly mixed with organic binder to form a total composition mixture. Three separate runs were made for both cupric oxide and cuprous oxide solid compositions using organic binder weight percentages (percent of the total composition) approximating 10.0%, 50%, 95.0%. After blending and mixing, the total composition mixture was applied to a ceramic substrate. The coated substrate was fired at a temperature of 850° C. until thermal equilibrium was achieved. The bonded substrate after cooling exhibited a bond which was classified as fair. Low crystalline growth was observed, and some particles of gold were visible. A small portion of the coating could be removed with a scraping effort. However, fairly extensive bonding was found to take place between the gold and the ceramic substrate. As usual, the changing weight percentages of the organic binder had no effect on the final bond produced.

EXAMPLE 6

| | Wt. percent |
|---|---|
| Copper oxide (percent solid composition) | 0.1 |
| Cadmium oxide (percent solid composition) | 15.0 |
| Gold powder (percent solid composition) | 84.9 |

The standard six runs were made for this example. With the above weight percentages one run was made using each of the following: cupric oxide and cuprous oxide (yielding two of the above sets of solid composition), 10.0%, 50%, and 95.0% ( wt. percent of total composition) of organic binder used for each of the two sets. Organic binder percentages and the use of cupric or cuprous oxide had little effect on the bonded substrate. A solid composition mixture was formed by blending together the copper oxide, cadmium oxide and gold powder. By adding the organic binder, a total composition mixture was formed. The total composition mixture was applied to a ceramic substrate. The coated substrate was placed in an oven and brought to substantially thermal equilibrium or fired at a temperature approximating 1063° C. The high temperature caused a melting of the gold. However, there were clearly seen discontinuous areas of adhesion. Low crystalline growth was observed due to the low amount of copper oxide used. Other particulates were observed which may have been due to the large amount of cadmium oxide used. The bond classification was given a laboratory rating of fair/poor.

EXAMPLE 7

| | Wt. percent |
|---|---|
| Copper oxide (percent solid composition) | 7.0 |
| Cadmium oxide (percent solid composition) | 15.0 |
| Gold powder (percent solid composition) | 78.0 |

The total composition mixture comprising the above listed weight percentages of copper oxide (as always two runs were made, one each for cuprous oxide and cupric oxide), cadmium oxide, and gold powder in combination with 10.0%, 50.0% and 95.0%, weight percentages (of total composition mixture) of organic binder. Blending was accomplished in accordance with the disclosed technique and applied to a ceramic substrate. The coated substrate was fired at a temperature approximating 850° C. Upon the usual cooling, the bonded substrate was observed to have very low crystalline growth. Particles of copper oxide were seen on the surface of the coating. Other particulates were observed and believed to be cadmium oxide particles. A portion of the coating (in particular the discrete particles) were found to be removable with a small scraping action. Bonding of the gold to the ceramic substrate was accomplished, but did not yield a visible homogeneous surface. The bond was given a laboratory classification of only fair/poor.

EXAMPLE 8

| | Wt. percent |
|---|---|
| Copper oxide (percent solid composition) | 7.0 |
| Cadmium oxide (percent solid composition) | 15.0 |
| Gold powder (percent solid composition) | 78.0 |

The copper oxide was blended with the cadmium oxide, gold powder and organic binder (10.0%, 50.0%, and 95.0%) as previously disclosed. The total composition mixture was applied to a ceramic substrate and fired at 1063° C. The coated substrate was found to have portions of gold melted thereon. Particles of copper oxide were seen and the coating appeared to have beads encased within it. Some bonding was achieved, however, such was classified as a fair bond since the surface properties were found to be visibly non-homogeneous. However, due to the high percentage of copper oxide used, the bond that was produced was good and although not visibly attractive, still usable. As in all examples, six runs were made associated with the different percentages of organic binder, cupric oxide and cuprous oxide. The results of all the runs were found to be substantially the same as to the bond produced.

EXAMPLE 9

| | Wt. percent |
|---|---|
| Copper oxide (percent solid composition) | 0.5 |
| Cadmium oxide (percent composition) | 3.0 |
| Gold powder (percent solid composition) | 96.5 |

The copper oxide (cuprous oxide as well as cupric oxide were run) was blended with the cadmium oxide powder and gold powder as has been previously described. Organic binder was added as shown in the disclosure. For both cuprous oxide and cupric oxide, three separate runs were made using organic binder weight percentages (percent of the total composition) of 10.0%, 50.0% and 95.0%. The various weight percentages were found to have no appreciable effect on the bond. However, a slight amount of residue was found on the surface of the coating after firing when 95.0% of organic binder was used. This residue was easily removed and did not effect the bond. The total composition mixture (copper oxide, cadmium oxide, gold powder, and organic binder) was applied to a ceramic substrate. The coated substrate was fired at a temperature approximating 950° C. The bond produced was excellent. The resulting bond formed was bright metallic in finish. The bond strength was found to be very high and not easily removable. Crystalline growth was observed with the copper oxide seen to impregnate the ceramic substrate. The runs made using the weight percentages of this example produced a uniform, substantially homogeneous coating which had a high thermal conductivity coupled with a low electrical resistivity. The bond was given a laboratory classification of excellent relative to the properties herein described.

EXAMPLE 10

| | Wt. percent |
|---|---|
| Copper oxide (percent solid composition) | 0.5 |
| Cadmium oxide (percent solid composition) | 0.25 |
| Gold powder (percent solid composition) | 99.25 |

Six runs were made for the above weight percentages. For both cuprous oxide and cupric oxide, their separate organic binder weight percentages were added: 10.0%, 50.0%, and 95.0% (percent of the total composition). The copper oxide, cadmium oxide, gold powder and organic binder were blended in the same manner as that shown for Example 10 (as well as for all examples herein described). The total composition mixture was applied to a ceramic substrate. The coated ceramic substrate was inserted into an oven maintained at 950° C. As was the case in other examples, the coated substrate was permitted to attain thermal equilibrium with the oven atmosphere. The substrate was removed from the oven and allowed to cool down to ambient thermal conditions. The resulting bond was bright metallic in surface finish. Crystalline growth was observed with the ceramic substrate being impregnated by the crystals to form an excellent bond. Thermal and electrical properties of this bond were found to be similar to those found for Example 9. Tensile strength of the bond was again found to be extremely high.

EXAMPLE 11

| | Wt. percent |
|---|---|
| Copper oxide (percent solid composition) | 0.75 |
| Cadmium oxide (percent composition) | 0.25 |
| Gold powder (percent solid composition) | 99.0 |

The copper oxide particles were blended with the cadmium oxide, gold powder and organic binder (10.0%, 50.0% and 95.0% of the total composition) in the weight percentages enumerated above. The copper oxide weight percentage was raised to 0.75% over the 0.5% used in Example 10. As usual, separate runs were made for cupric oxide and cuprous oxide powders. The specific constituents were blended or mixed together as shown in the previous description. The total composition mixture was applied to a ceramic substrate and fired at 980° C. Upon cooling, the resultant coating bond was found to have a high tensile loading strength. The resultant coating was bright metallic in finish and showed excellent crystalline growth of the copper oxide. Crystalline impregnation of the ceramic layer was visible at various coating thickness ranges between 50 millionths and .002 of an inch. Efforts to remove the bonded layer resulted in the destruction of the ceramic substrate. The bond was classified as excellent.

EXAMPLE 12

| | Wt. percent |
|---|---|
| Copper oxide (percent solid composition) | 0.9 |
| Cadmium oxide (percent solid composition) | 0.1 |
| Gold powder (percent solid composition) | 99.0 |

The gold powder, cadmium oxide, copper oxide (cuprous oxide and cupric oxide used in separate runs) and organic binder were blended into a total composition mixture. Three separate runs were made for organic binder weight percentages between 10.0% and 95.0% (of total composition). The various organic binder weight percentages were found to have no discernible effect on the bond produced. After blending, the total composition mixture was applied to a ceramic substrate. The coated substrate was fired at a temperature approximating 980° C. The bond produced had a bright metallic finish and showed even more crystalline growth than that observed in Example 11. Crystalline impregnation of the ceramic layer was again observed. Efforts to forcibly remove the bonded layer once again resulted in destruction of the ceramic substrate. The runs made using the weight percentages of this example produced a visibly uniform substantially homogeneous coating. Thermal conductivity remained near that of pure gold. A low electrical resistivity (near that of gold) was observed for layer thicknesses between 50 millionths and 0.002 of an inch. The resulting bond was classified as excellent with respect to the properties herein described.

EXAMPLE 13

| | Wt. percent |
|---|---|
| Copper oxide (percent solid composition) | 0.1 |
| Cadmium oxide (percent solid composition) | 0.25 |
| Gold powder (percent solid composition) | 99.65 |

The copper oxide, cadmium oxide, gold powder and organic binder were blended together as previously disclosed. As usual, six (6) runs were made for three weight percentages of organic binder 10.0%, 50.0%, 95.0% (percent of total composition) as applied separately to both cuprous oxide and cupric oxide. The various organic binder weights had no discernible effect on the bond produced. The use of cuprous oxide or cupric oxide also produced essentially the same bonded coating. The total composition mixture was applied to a ceramic substrate. The coated substrate was fired at a temperature approximating 980° C. The resulting bond, examined after cooling showed a bright metallic finish. High thermal conductivity coupled with low electrical resistivity were observed. Tensile strength of the bond was excellent and destruction of the ceramic substrate was necessary to break the bond. Copper oxide crystalline growth was observed. The bond was given a laboratory classification of excellent.

It is to be understood that the foregoing description including the specific examples of this invention is made by way of illustration only and is not to be considered as a limitation of its scope.

What is claimed is:

1. A metalizing composition consisting essentially of an intimate mixture, on a weight basis, of: (A) about 0.1% to 7.0% of at least one copper oxide powder from the group consisting of cuprous oxide and cupric oxide; (B) about 0.01% to 15.0% of cadmium oxide powder; (C) 78.0% to 99.89% of gold powder, said copper oxide powder and said cadmium oxide powder and said gold powder defining in combination a solid composition mixture, said weight percentages of said copper oxide, said cadmium oxide and said gold powder pertaining to said solid composition mixture; and, (D) about 10.0% to 95.0% of an organic binder devoid of glass frits, said organic binder in combination with said copper oxide powder, said cadmium oxide powder and said gold powder defining a total composition mixture, said weight percentage of said organic binder pertaining to said total composition mixture.

2. The metalizing composition as recited in claim 1 wherein composition (A) is cuprous oxide.

3. The metalizing composition as recited in claim 2 wherein said weight percentage of said cuprous oxide is within the range between 0.25% and 3.0% of said solid composition mixture.

4. The metalizing composition as recited in claim 3 wherein said weight percentage of said cadmium oxide is within the range between 0.05% and 10.0% of said solid composition mixture.

5. The metalizing composition as recited in claim 4 wherein said weight percentage of said organic binder is wtihin the range between 15.0% and 50.0% of said total composition mixture.

6. The metalizing composition as recited in claim 3 wherein said weight percentage of said cadmium oxide is within the approximate range between 1.0% and 5.0% of said solid composition mixture.

7. The metalizing composition as recited in claim 6 wherein said weight percentage of said organic binder is within the approximate range between 15.0% and 50.0% of said total composition mixture.

8. The metalizing composition as recited in claim 1 wherein composition (A) is cupric oxide.

9. The metalizing composition as recited in claim 8 wherein said weight percentages of said cupric oxide is within the range between 0.25% and 3.0% of said solid composition mixture.

10. The metalizing composition as recited in claim 9 wherein said weight percentage of said cadmium oxide is within the range between 0.05% and 10.0% of said solid composition mixture.

11. The metalizing composition as recited in claim 10 wherein said weight percentage of said organic binder is within the approximate range between 15.0% and 50.0% of said total composition mixture.

12. The metalizing composition as recited in claim 9 wherein said weight percentage of said cadmium oxide is within the approximate range between 1.0% and 5.0% of said solid composition mixture.

13. The metalizing composition as recited in claim 12 wherein said weight percentage of said organic binder is within the approximate range between 15.0% and 50.0% of said total composition mixture.

References Cited

UNITED STATES PATENTS

| | | | |
|---|---|---|---|
| 3,440,182 | 4/1969 | Hoffman | 252—514 |
| 3,622,523 | 11/1971 | Amin et al. | 117—227 |
| 3,407,081 | 10/1968 | Ballard | 117—227 |

RALPH S. KENDALL, Primary Examiner

J. W. MASSIE Assistant Examiner

U.S. Cl. X.R.

117—160 R, 161 R, 227; 106—1